US012592280B2

(12) United States Patent
Yu et al.

(10) Patent No.: US 12,592,280 B2
(45) Date of Patent: Mar. 31, 2026

(54) RESISTIVE RANDOM ACCESS MEMORY AND MEMORY MINI-ARRAY THEREOF WITH IMPROVED RELIABILITY

(71) Applicant: UNITED MICROELECTRONICS CORP., Hsin-Chu City (TW)

(72) Inventors: Shu-Hung Yu, Kaohsiung City (TW); Chuan-Fu Wang, Miaoli County (TW); Chung-Chin Shih, Hsinchu County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 140 days.

(21) Appl. No.: 18/367,488

(22) Filed: Sep. 13, 2023

(65) Prior Publication Data

US 2025/0046372 A1    Feb. 6, 2025

(30) Foreign Application Priority Data

Aug. 2, 2023    (TW) .................................. 112128971

(51) Int. Cl.
*G11C 13/00*              (2006.01)
(52) U.S. Cl.
CPC ........ *G11C 13/004* (2013.01); *G11C 13/0028* (2013.01); *G11C 13/0069* (2013.01)
(58) Field of Classification Search
CPC .............. G11C 13/004; G11C 13/0028; G11C 13/0069; G11C 2213/74; G11C 2213/79; G11C 11/1675; G11C 13/0002; G11C 13/0007; G11C 13/003; G11C 13/0009; G11C 13/0026; H10B 63/80; H10B 63/30; H10N 70/8833
See application file for complete search history.

(56) References Cited

U.S. PATENT DOCUMENTS 9,054,702 B2      6/2015   Nazarian
9,065,044 B2 *    6/2015   Scheuerlein ........... H10B 63/84
9,356,598 B2      5/2016   Vrudhula
(Continued)

FOREIGN PATENT DOCUMENTS

CN          115565579 A       1/2023
DE     10 2018 123 822 A1    4/2019
(Continued)

*Primary Examiner* — Khamdan N. Alrobaie
(74) *Attorney, Agent, or Firm* — Winston Hsu

(57)              ABSTRACT
A memory includes a first switch transistor, a second switch transistor, a third switch transistor, a fourth switch transistor, a first resistive memory element and a second resistive memory element. Each of the first switch transistor, the second switch transistor, the third switch transistor and the fourth switch transistor includes a drain terminal, a source terminal and a gate terminal. The drain terminal of the third switch transistor is coupled to the source terminal of the first switch transistor. The drain terminal of the fourth switch transistor is coupled to the source terminal of the second switch transistor. The first resistive memory element is coupled to the source terminal of the fourth switch transistor and the source terminal of the first switch transistor. The second resistive memory element is coupled to the source terminal of the third switch transistor and the source terminal of the second switch transistor.

8 Claims, 10 Drawing Sheets

(56) References Cited

U.S. PATENT DOCUMENTS

| | | | |
|---|---|---|---|
| 9,401,198 B1 | 7/2016 | Roy | |
| 9,496,048 B2 | 11/2016 | Chen | |
| 10,056,430 B1 | 8/2018 | Mihajlovic | |
| 10,461,126 B2 | 10/2019 | Tsai | |
| 11,189,658 B2 | 11/2021 | Wei | |
| 2009/0250735 A1* | 10/2009 | Asao | G11C 11/1659 |
| | | | 257/295 |
| 2012/0044757 A1* | 2/2012 | Chung | G11C 13/003 |
| | | | 365/175 |
| 2012/0294064 A1* | 11/2012 | Kitagawa | G11C 13/0061 |
| | | | 365/148 |
| 2012/0314472 A1* | 12/2012 | Chung | G11C 13/0007 |
| | | | 365/158 |
| 2017/0047116 A1* | 2/2017 | Sandhu | G11C 13/003 |
| 2019/0341109 A1 | 11/2019 | Fuchikami | |
| 2021/0398618 A1 | 12/2021 | Ma | |
| 2022/0059616 A1 | 2/2022 | Lee | |
| 2023/0164970 A1 | 5/2023 | Goto | |

FOREIGN PATENT DOCUMENTS

| | | | |
|---|---|---|---|
| DE | 10 2018 124 716 A1 | 5/2019 | |
| DE | 11 2022 003 362 T5 | 5/2024 | |
| WO | 2017/064744 A1 | 4/2017 | |

* cited by examiner

RESISTIVE RANDOM ACCESS MEMORY AND MEMORY MINI-ARRAY THEREOF WITH IMPROVED RELIABILITY

BACKGROUND OF THE INVENTION

1. Field of the Invention

The disclosure is related to a resistive random access memory and a memory mini-array, and more particularly, a resistive random access memory and a memory mini-array with improved reliability.

2. Description of the Prior Art

With the development of memory technology, resistive random access memories (RRAMs) are currently available. A resistive memory may include a resistive memory element. By applying a voltage, the resistance of the resistive memory element can be changed, so as to write and erase data with the resistive memory element.

However, current resistive memory elements have many shortcomings. For example, it is difficult to distinguish the resistance of a conventional resistive memory after many times of writing and reading (for example, 100,000 times). Therefore, after multiple accesses, it is difficult to correctly read the data stored in the memory, resulting in insufficient reliability. In addition, in the current resistive memory, same electrodes of different resistive memory elements are formed at opposite ends, thereby involving many complicated traces, and making it difficult to reduce the area of the memory.

SUMMARY OF THE INVENTION

An embodiment provides a memory including a first switch transistor, a second switch transistor, a third switch transistor, a fourth switch transistor, a first resistive memory element and a second resistive memory element. The first switch transistor can include a drain terminal, a source terminal and a gate terminal. The second switch transistor can include a drain terminal, a source terminal and a gate terminal. The third switch transistor can include a drain terminal coupled to the source terminal of the first switch transistor, a source terminal and a gate terminal. The fourth switch transistor can include a drain terminal coupled to the source terminal of the second switch transistor, a source terminal and a gate terminal. The first resistive memory element can include a first terminal coupled to the source terminal of the fourth switch transistor, and a second terminal coupled to the source terminal of the first switch transistor. The second resistive memory element can include a first terminal coupled to the source terminal of the third switch transistor, and a second terminal coupled to the source terminal of the second switch transistor.

Another embodiment provides a memory including a first diffusion layer, a second diffusion layer, a first polysilicon layer, a second polysilicon layer, a first resistive memory element and a second resistive memory element. The first diffusion layer can be formed along a first direction. The second diffusion layer can be formed along the first direction. The first polysilicon layer can be formed along a second direction and at least partially overlapped with the first diffusion layer and the second diffusion layer, where the first direction is substantially perpendicular to the second direction. The second polysilicon layer can be formed along the second direction and at least partially overlapped with the first diffusion layer and the second diffusion layer. The first resistive memory element can be formed at least partially overlapped with the first diffusion layer and between the first polysilicon layer and the second polysilicon layer. The second resistive memory element can be formed at least partially overlapped with the second diffusion layer and between the first polysilicon layer and the second polysilicon layer.

Another embodiment provides a memory mini-array including a first diffusion layer, a second diffusion layer, a first polysilicon layer, a second polysilicon layer, a third polysilicon layer, a fourth polysilicon layer, a first resistive memory element, a second resistive memory element, a third resistive memory element and a fourth resistive memory element. The first diffusion layer can be formed along a first direction. The second diffusion layer can be formed along the first direction. The first polysilicon layer can be formed along a second direction and at least partially overlapped with the first diffusion layer and the second diffusion layer, where the first direction is substantially perpendicular to the second direction. The second polysilicon layer can be formed along the second direction and at least partially overlapped with the first diffusion layer and the second diffusion layer. The third polysilicon layer can be formed along the second direction and at least partially overlapped with the first diffusion layer and the second diffusion layer. The fourth polysilicon layer can be formed along the second direction and at least partially overlapped with the first diffusion layer and the second diffusion layer, where the third polysilicon layer is formed between the second polysilicon layer and the fourth polysilicon layer. The first resistive memory element can be formed at least partially overlapped with the first diffusion layer and between the first polysilicon layer and the second polysilicon layer. The second resistive memory element can be formed at least partially overlapped with the second diffusion layer and between the first polysilicon layer and the second polysilicon layer. The third resistive memory element can be formed at least partially overlapped with the first diffusion layer and between the third polysilicon layer and the fourth polysilicon layer. The fourth resistive memory element can be formed at least partially overlapped with the second diffusion layer and between the third polysilicon layer and the fourth polysilicon layer. The first polysilicon layer, the second polysilicon layer, the first resistive memory element and the second resistive memory element can be corresponding to a first memory. The third polysilicon layer, the fourth polysilicon layer, the third resistive memory element and the fourth resistive memory element can be corresponding to a second memory. The memory mini-array can include the first memory and the second memory.

Another embodiment provides a memory including a first diffusion layer, a second diffusion layer, a first conductive layer, a second conductive layer, a first resistive memory element and a second resistive memory element. The first conductive layer can be formed above the first diffusion layer. The second conductive layer can be formed above the second diffusion layer. The first resistive memory element can be formed above the first conductive layer. The second resistive memory element can be formed above the second conductive layer. The first conductive layer and the second first conductive layer can be formed of a same conductive layer.

These and other objectives of the present invention will no doubt become obvious to those of ordinary skill in the art after reading the following detailed description of the pre-
ferred embodiment that is illustrated in the various figures
and drawings.

DETAILED DESCRIPTION

In order to increase the allowable number of times of
accessing a memory and reduce the memory area, a memory
and a memory mini-array are provided according to embodi-
ments. In the text, when an object A is formed at least
partially overlapped with an object B, it means that at least
a part of the object A can overlap with at least a part of the
object B, or the object A can completely overlap with the
object B in a top view. In the text, a conductive via (a.k.a.
VIA) can be a conductive connection path formed by
drilling a hole and plating the hole with conductive
material(s). Each of the memory 100 and the memory 200
mentioned herein can be a bit-cell of a resistive random-
access memory (RRAM).

Figure 1:
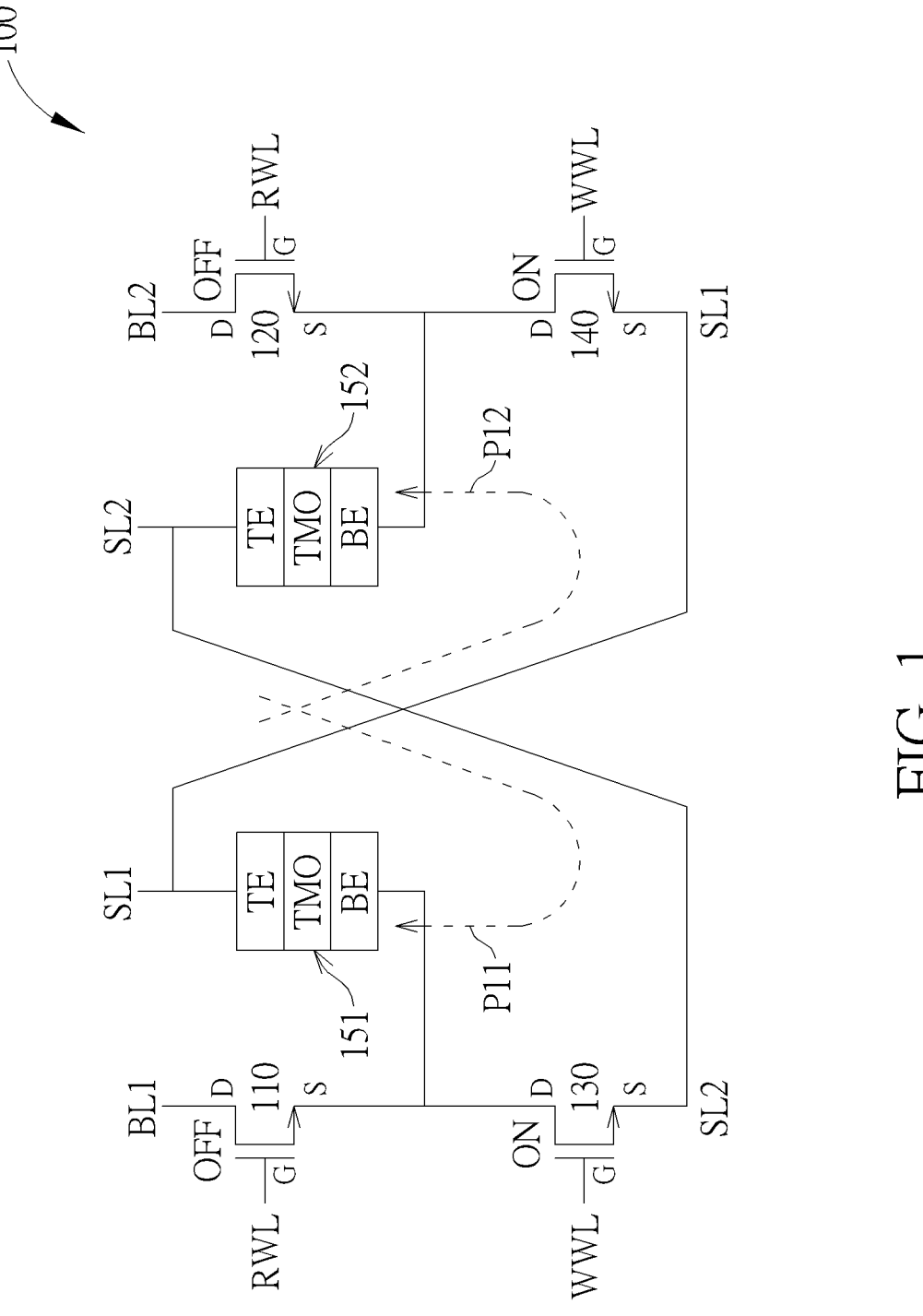
FIG. 1 illustrates a writing operation of a memory accord-
ing to an embodiment.
Figure 2:
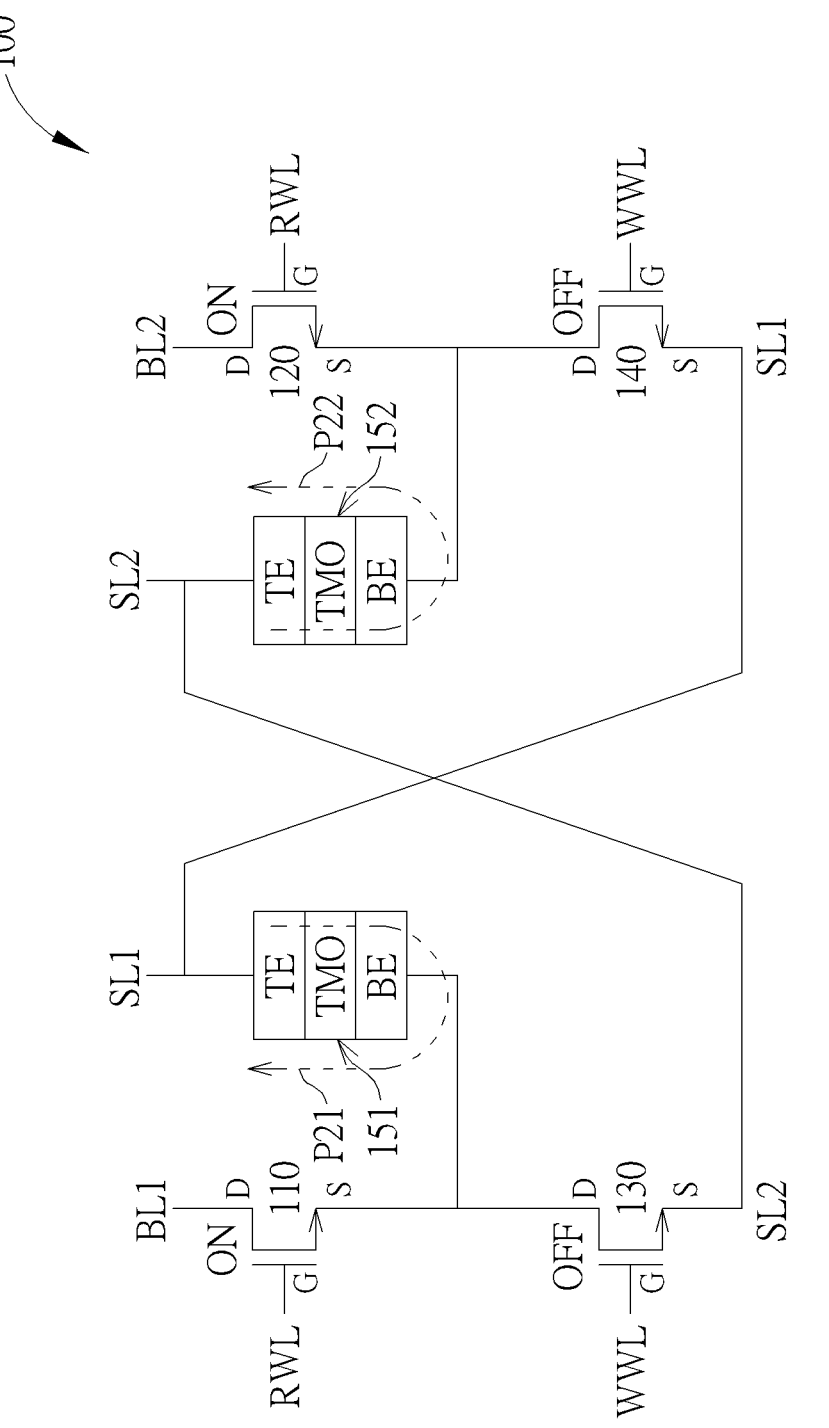
FIG. 2 illustrates a reading operation of the memory in
FIG. 1.

FIG. 1 and FIG. 2 illustrate a memory 100 according to an
embodiment. FIG. 1 shows a writing operation of the
memory 100. FIG. 2 shows a reading operation of the
memory 100.

As shown in FIG. 1 and FIG. 2, the memory 100 can
include a first switch transistor 110, a second switch tran-
sistor 120, a third switch transistor 130, a fourth switch
transistor 140, a first resistive memory element 151 and a
second resistive memory element 152. The first switch
transistor 110 can include a drain terminal, a source terminal
and a gate terminal. The second switch transistor 120 can
include a drain terminal, a source terminal and a gate
terminal. The third switch transistor 130 can include a drain
terminal, a source terminal and a gate terminal, where the
drain terminal of the third switch transistor 130 can be
coupled to the source terminal of the first switch transistor
110. The fourth switch transistor 140 can include a drain
terminal, a source terminal and a gate terminal, where the
drain terminal of the fourth switch transistor 140 can be
coupled to the source terminal of the second switch transis-
tor 120.

The first resistive memory element 151 can include a first
terminal and a second terminal. The first terminal of the first
resistive memory element 151 can be coupled to the source
terminal of the fourth switch transistor 140. The second
terminal of the first resistive memory element 151 can be
coupled to the source terminal of the first switch transistor
110. The second resistive memory element 152 can include
a first terminal and a second terminal. The first terminal of
the second resistive memory element 152 can be coupled to
the source terminal of the third switch transistor 130. The second terminal of the second resistive memory element 152
can be coupled to the source terminal of the second switch
transistor 120.

As shown in FIG. 1 and FIG. 2, each of the first resistive
memory element 151 and the second resistive memory
element 152 can include a top electrode TE, a bottom
electrode BE and a transition metal oxide layer TMO. The
top electrode TE of the first resistive memory element 151
can be coupled to the first terminal of the first resistive
memory element 151. The bottom electrode BE of the first
resistive memory element 151 can be coupled to the second
terminal of the first resistive memory element 151. The
transition metal oxide layer TMO of the first resistive
memory element 151 can be formed between the top elec-
trode TE and the bottom electrode BE of the first resistive
memory element 151. Likewise, the top electrode TE of the
second resistive memory element 152 can be coupled to the
first terminal of the second resistive memory element 152.
The bottom electrode BE of the second resistive memory
element 152 can be coupled to the second terminal of the
second resistive memory element 152. The transition metal
oxide layer TMO of the second resistive memory element
152 can be formed between the top electrode TE and the
bottom electrode BE of the second resistive memory ele-
ment 152.

As shown in FIG. 1 and FIG. 2, the drain terminal of the
first switch transistor 110 can be coupled to a first bit line
BL1. The gate terminal of the first switch transistor 110 can
be coupled to a read word line RWL. The drain terminal of
the second switch transistor 120 can be coupled to a second
bit line BL2. The gate terminal of the second switch tran-
sistor 120 can be coupled to the read word line RWL. The
gate terminal of the third switch transistor 130 can be
coupled to a write word line WWL. The source terminal of
the third switch transistor 130 can be coupled to a second
source line SL2. The gate terminal of the fourth switch
transistor 140 can be coupled to the write word line WWL.
The source terminal of the fourth switch transistor 140 can
be coupled to a first source line SL1.

As shown in FIG. 1, when the first switch transistor 110
and the second switch transistor 120 are turned off, and the
third switch transistor 130 and the fourth switch transistor
140 are turned on, data can be written to the memory 100
through the first source line SL1 and the second source line
SL2. As shown in FIG. 1, data can be written to the first
resistive memory element 151 and the second resistive
memory element 152 through a path P11 and a path P12.

In FIG. 1, when writing a logic 0 to the memory 100, the
first source line SL1 can have a high voltage level (expressed
as VH in the text), the second source line SL2 can have a low
voltage level (expressed as VL in the text) lower than the
high voltage level VH, the first resistive memory 151 can be
set to have a high resistance (expressed as RH in the text),
and the second resistive memory element 152 can be set to
have a low resistance (expressed as RL in the text) lower
than the high resistance RH.

In FIG. 1, when writing a logic 1 to the memory 100, the
first source line SL1 can have the low voltage level VL, the
second source line SL2 can have the high voltage level VH,
the first resistive memory 151 can be set to have the low
resistance RL, and the second resistive memory element 152
can be set to have the high resistance RH.

As shown in FIG. 2, when the first switch transistor 110
and the second switch transistor 120 are turned on, and the
third switch transistor 130 and the fourth switch transistor
140 are turned off, data can be read from the memory 100.
As shown in FIG. 2, data can be read from the first resistive memory element 151 and the second resistive memory element 152 through a path P21 and a path P22.

In FIG. 2, when reading a logic 0 from the memory 100, the first source line SL1 can have the high voltage level VH, and the second source line SL2 can have the high voltage level VH. In FIG. 2, when reading a logic 1 from the memory 100, the first source line SL1 can have the high voltage level VH, and the second source line SL2 can have the high voltage level VH.

The abovementioned writing operation and reading operation of the memory 100 can be described in Table 1.

TABLE 1

| When writing a logic 0 | The first source line SL1: high voltage level VH The second source line SL2: low voltage level VL The first resistive memory element 151: high resistance RH The second resistive memory element 152: low resistance RL | In FIG.1, the first switch transistor 110 and the second switch transistor 120 are turned off, and the third switch transistor |
|---|---|---|
| When writing a logic 1 | The first source line SL1: low voltage level VL The second source line SL2: high voltage level VH The first resistive memory element 151: low resistance RL The second resistive memory element 152: high resistance RH | 130 and the fourth switch transistor 140 are turned on. |
| When reading a logic 0 When reading a logic 1 | The first source line SL1: high voltage level VH The second source line SL2: high voltage level VH | In FIG.2, the first switch transistor 110 and the second switch transistor 120 are turned on, and the third switch transistor 130 and the fourth switch transistor 140 are turned off. |

Figure 3:
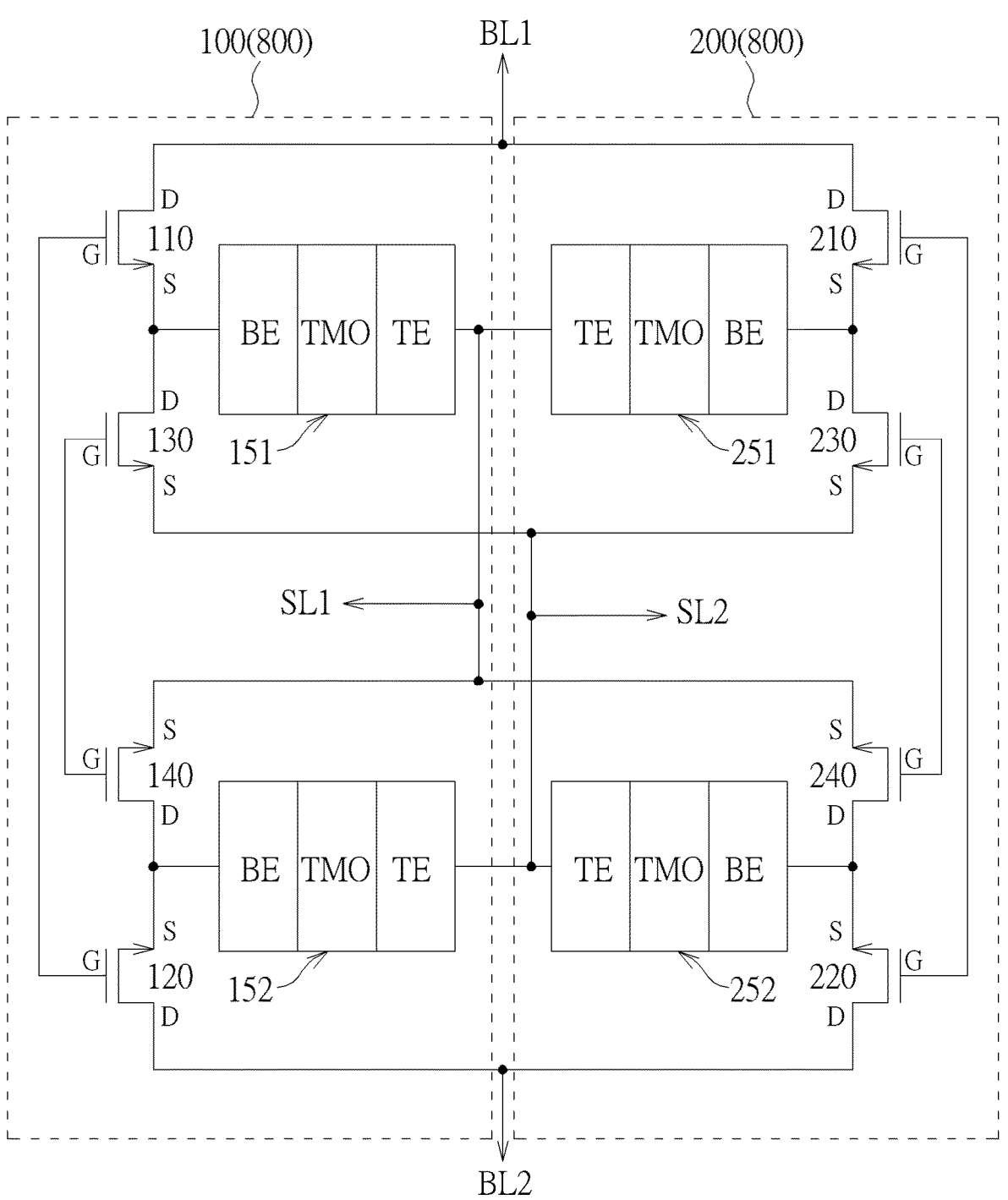
FIG. 3 illustrates a circuit including two memories
according to an embodiment.

FIG. 3 illustrates a circuit including the memory 100 and a memory 200 according to an embodiment. As shown in FIG. 3, the memory 100 can be coupled to the memory 200, and the memory 200 can be coupled to the first bit line BL1, the second bit line BL2, the first source line SL1 and the second source line SL2. The circuit area is reduced by coupling the memory 100 to the memory 200. In FIG. 2, the memory 100 can include the first switch transistor 110 to the fourth switch transistor 140, the first resistive memory element 151 and the second resistive memory element 152 as mentioned above, and thus is not repeatedly described. Like the first switch transistor 110 to the fourth switch transistor 140, the first resistive memory element 151 and the second resistive memory element 152 in the memory 100, the memory 200 can include a fifth switch transistor 210, a sixth switch transistor 220, a seventh switch transistor 230, an eighth switch transistor 240, a third resistive memory element 251 and a fourth resistive memory element 252. The couplings of components and operations of the memory 200 can be similar to that of the memory 100, and is not repeatedly described.

As shown in FIG. 1 to FIG. 3, same electrodes of the first resistive memory element 151 and the second resistive memory element 152 are formed at same ends, e.g., bottom electrodes BE of the first resistive memory element 151 and the second resistive memory element 152 are coupled to the sources of the first switch transistor 110 and the second switch transistor 120 respectively. Hence, the related connections of the components of the memory 100 are simplified.

Figure 8:
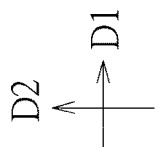

As shown in FIG. 3, the memory 100 and the memory 200 can share the first bit line BL1, the second bit line BL2, the first source line SL1 and the second source line SL2. Regarding the layout of semiconductor, the memory 100 and the memory 200 can be integrated in a memory mini-array 800 in the layout as shown in FIG. 8.

FIG. 4 to FIG. 8 illustrate layout diagrams of a manufacturing process of the memory 100 according to an embodiment. In the manufacturing process of the memory 100, the layout diagrams can be shown sequentially as FIG. 4, FIG. 5, FIG. 6, FIG. 7 and FIG. 8 according to time sequence.

Figure 4:
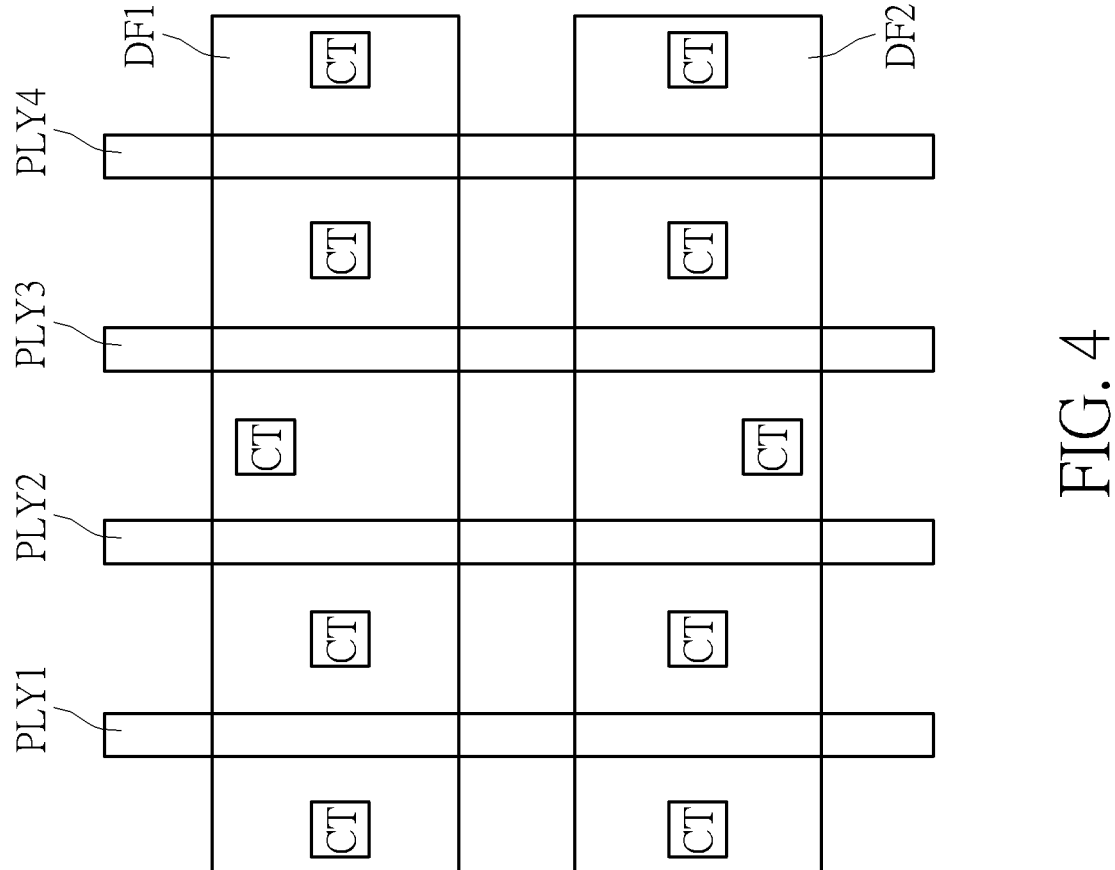
FIG. 4 to FIG. 8 illustrate layout diagrams of a manufac-
turing process of the memory in FIG. 1 according to an
embodiment.

As shown in FIG. 4, the memory 100 can include a diffusion layer DF1, a diffusion layer DF2, a polysilicon layer PLY1, a polysilicon layer PLY2, a polysilicon layer PLY3 and a polysilicon layer PLY4. The polysilicon layer PLY1, the polysilicon layer PLY2, the polysilicon layer PLY3 and the polysilicon layer PLY4 can be corresponding to gate terminals of transistors, such as gate terminals of field effect transistors (FETs). The diffusion layers DF1 and DF2 can be formed along a first direction D1. The polysilicon layer PLY1 to the polysilicon layer PLY4 can be formed along a second direction D2 substantially perpendicular to the first direction D1. Each of the polysilicon layer PLY1 to the polysilicon layer PLY4 can be formed at least partially overlapped with the diffusion layer DF1 and the diffusion layer DF2. In FIG. 4, the diffusion layer DF1 and the diffusion layer DF2 can be formed of a same diffusion layer. For example, a trench can be formed to separate the diffusion layer DF1 from the diffusion layer DF2. As shown in FIG. 4, a plurality of contact elements CT can be formed on the diffusion layers DF1, DF2. In the top view, each of the contact elements CT can be disposed between two polysilicon layers.

If the polysilicon layer PLY1 in FIG. 4 are corresponding to the gate terminals of the first switch transistor 110 and the second switch transistor 120 in FIG. 1, and the polysilicon layer PLY2 in FIG. 4 are corresponding to the gate terminals of the third switch transistor 130 and the fourth switch transistor 140 in FIG. 1, the polysilicon layer PLY1 can be coupled to the read word line RWL in FIG. 1, and the polysilicon layer PLY2 in FIG. 4 can be coupled to the write word line WWL in FIG. 1.

Figure 5:
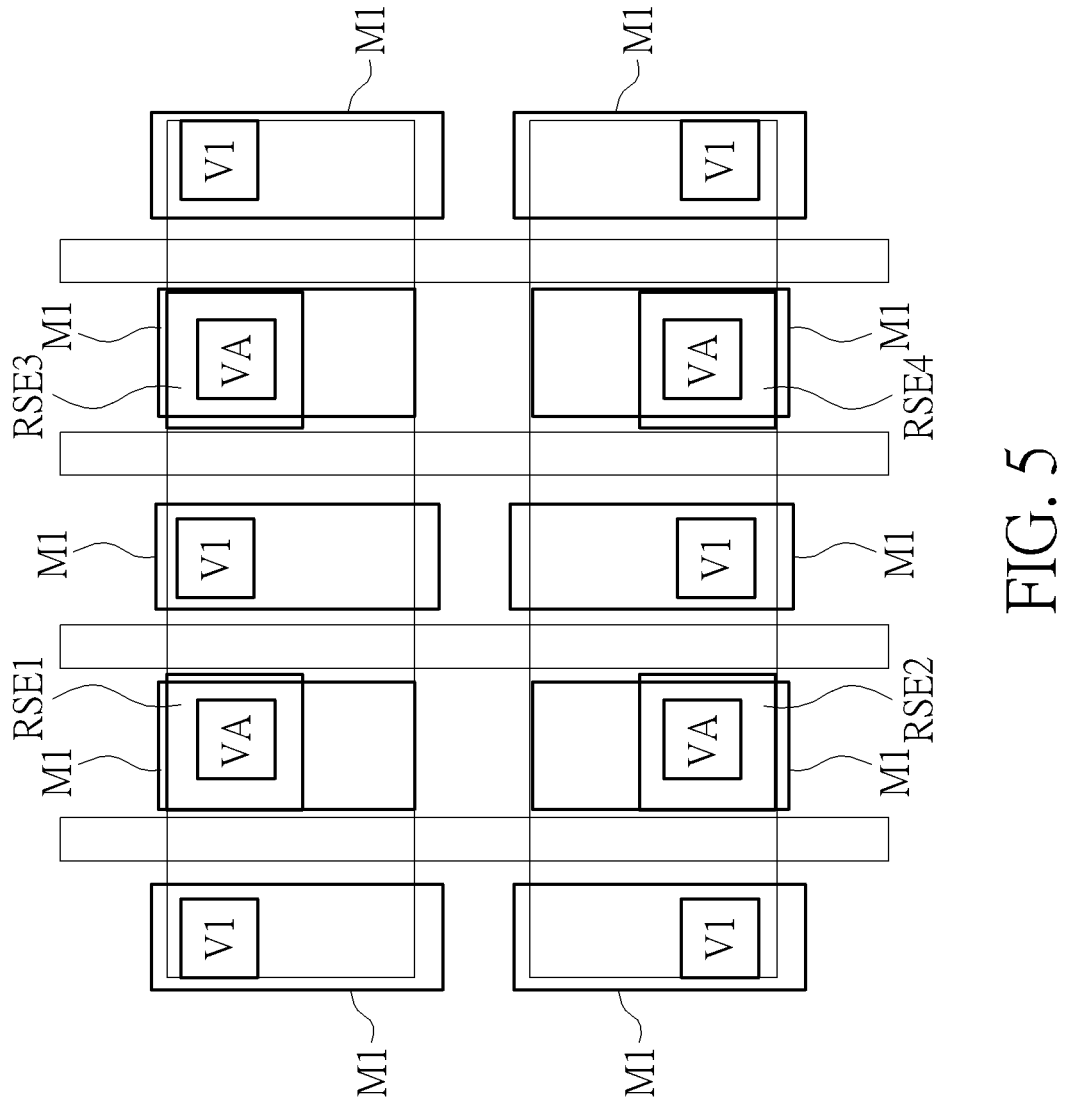
Figure 5:
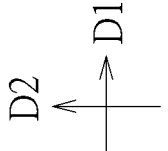

In FIG. 5, a conductive layer M1, a plurality of conductive vias VA and a plurality of resistive memory elements RSE1, RSE2, RSE3 and RSE4 can be formed above the diffusion layers DF1 and DF2. One of the resistive memory elements RSE1, RSE2, RSE3 and RSE4 can be corresponding to one of the first resistive memory element 151, the second resistive memory element 152, the third resistive memory element 251 and the fourth resistive memory element 252 mentioned in FIG. 1 to FIG. 3. As shown in FIG. 5, in the top view, the resistive memory element RSE1 can be formed at least partially overlapped with the diffusion layer DF1 and between the polysilicon layer PLY1 and the polysilicon layer PLY2. The resistive memory element RSE2 can be formed at least partially overlapped with the diffusion layer DF2 and between the polysilicon layer PLY1 and the polysilicon layer PLY2.

Figure 6:
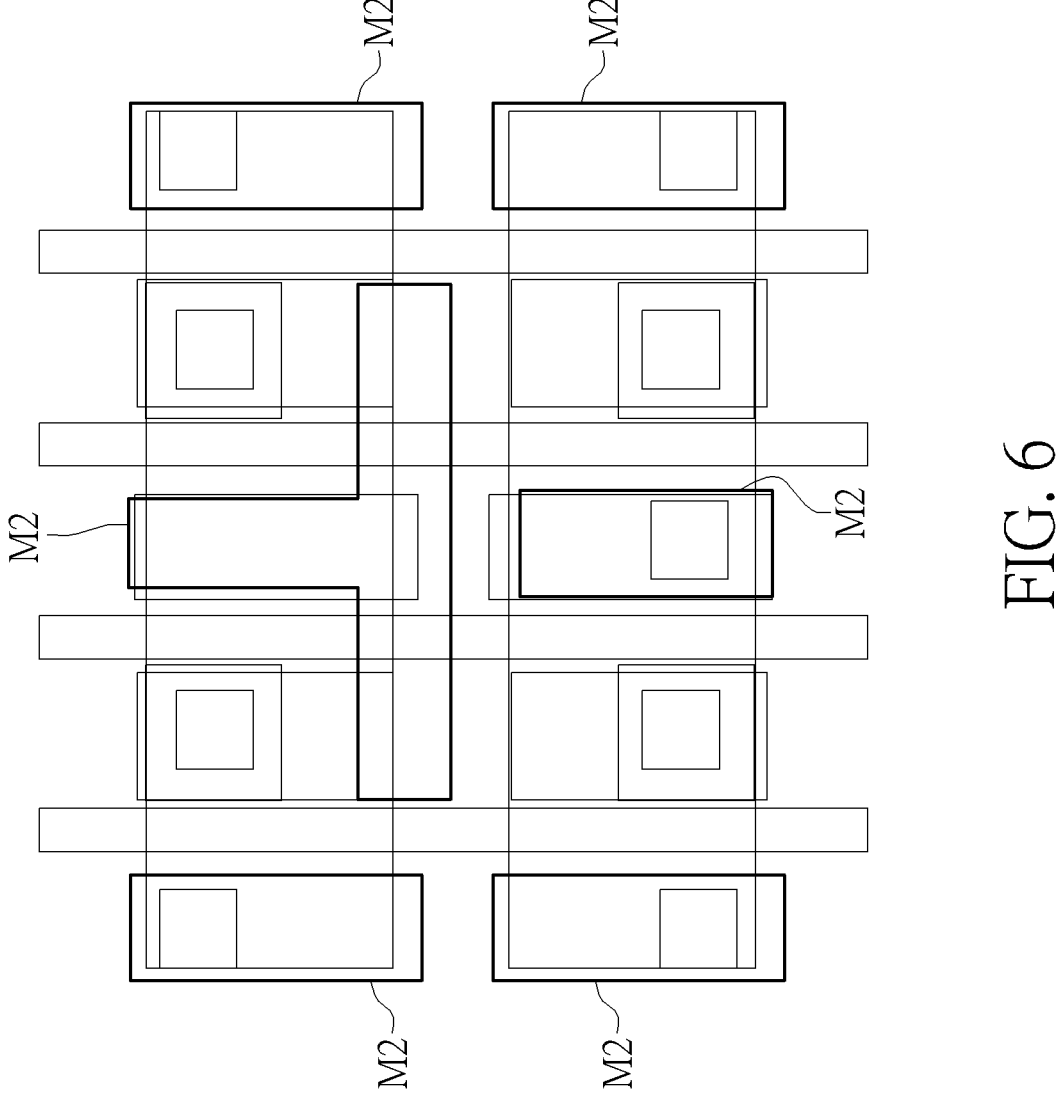

In FIG. 6, a conductive layer M2 can be further formed above the diffusion layer DF1 and the diffusion layer DF2. In the top view, the conductive layer M2 may not overlap with the resistive memory elements RSE1, RSE2, RSE3 and RSE4.

Figure 7:
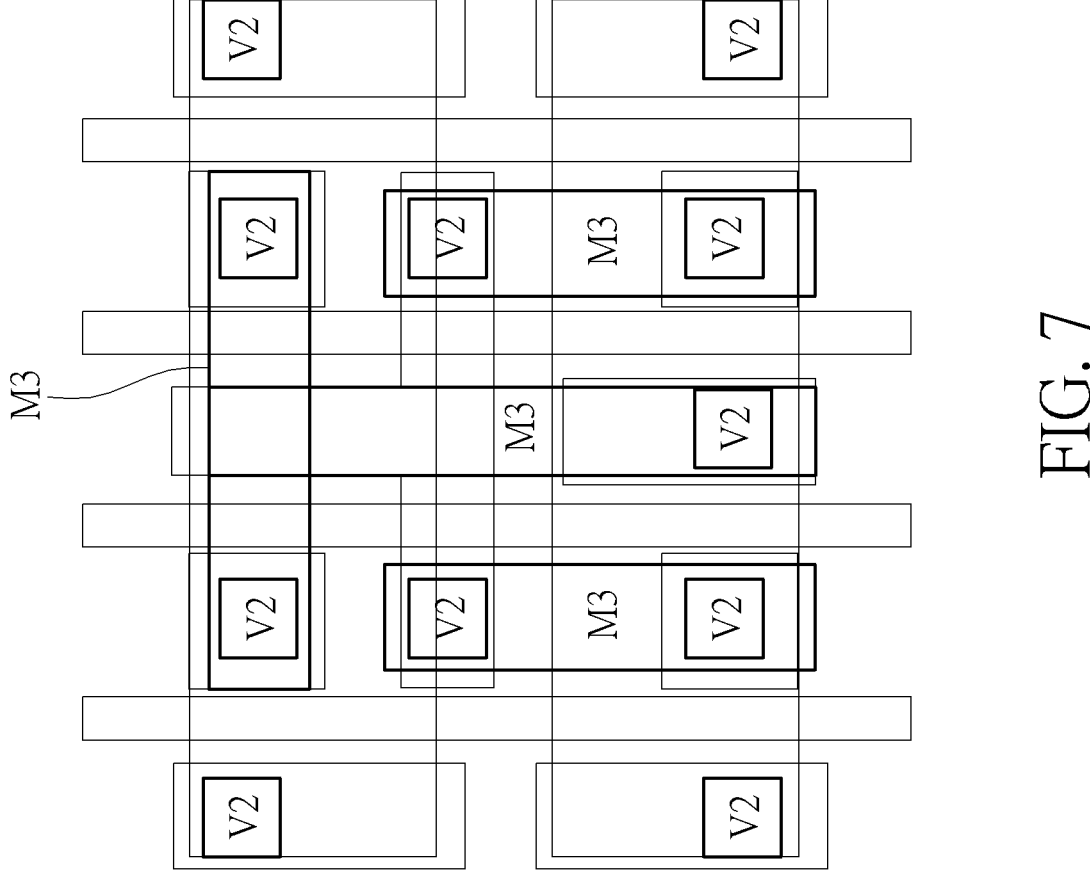

As shown in FIG. 7, a conductive layer M3 and a plurality of conductive vias V2 can be further formed above the conductive layer M2 and the resistive memory elements RSE1 to RSE4.

As shown in FIG. 8, a conductive layer M4 and a plurality of conductive vias V3 can be further formed above the conductive layer M3.

In FIG. 8, the first switch transistor 110, the second switch transistor 120, the third switch transistor 130, the fourth switch transistor 140, the resistive memory element RSE1 and the resistive memory element RSE2 can be used to form a memory including four switch transistors and two resistive memory elements, and the memory can be referred to as a 4T2R memory (e.g. the abovementioned memory 100). The fifth switch transistor 210, the sixth switch transistor 220, the seventh switch transistor 230, the eighth switch transistor 240, the resistive memory element RSE3 and the resistive memory element RSE4 can be used to form another memory including four switch transistors and two resistive memory elements, and the memory can be referred to as a 4T2R memory (e.g. the abovementioned memory 200). In the layout, the memory 100 and the memory 200 can be used to form the memory mini-array 800, and the memory 100 and the memory 200 can share the bit lines and source lines as shown in FIG. 3.

Figure 9:
FIG. 9 illustrates a cross-section view of the memory in
FIG. 8 along the cross-sectional line 9-9'.
Figure 9:
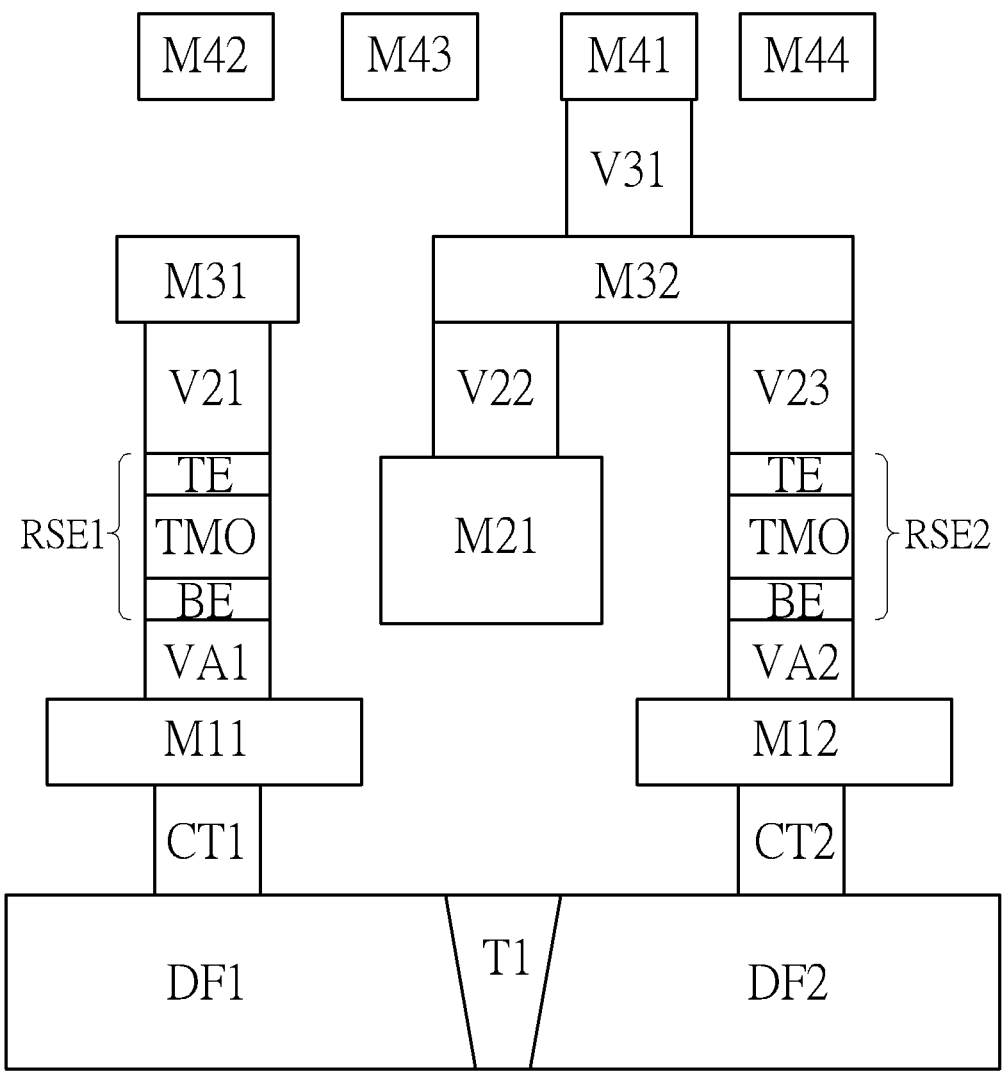

FIG. 9 is a cross-section view of the memory 100 in FIG. 8 along the cross-sectional line 9-9'. As shown in FIG. 8, the memory 100 can include the diffusion layer DF1, the diffusion layer DF2, a conductive layer M11, a conductive layer M12, a contact element CT1, a contact element CT2, a conductive via VA1, a conductive via VA2, a resistive memory element RSE1, a resistive memory element RSE2, a conductive layer M21, a conductive via V21, a conductive via V22, a conductive via V23, a conductive layer M31, a conductive layer M32, a conductive layer M41, a conductive layer M42, a conductive layer M43, a conductive layer M44 and a conductive via V31.

In FIG. 9, a trench T1 can be used to separate the diffusion layer DF1 from the diffusion layer DF2. The conductive layer M11 can be formed at least partially overlapped with the diffusion layer DF1. In the top view, the conductive layer M11 can be formed between the polysilicon layer PLY1 and the polysilicon layer PLY2. The conductive layer M12 can be formed at least partially overlapped with the diffusion layer DF2. In the top view, the conductive layer M12 can be formed between the polysilicon layer PLY1 and the polysilicon layer PLY2. The conductive layer M11 and the conductive layer M12 in FIG. 9 can be formed of a same conductive layer, such as the conductive layer M1 in FIG. 5. As shown in FIG. 9, the conductive layer M11 can be formed above the diffusion layer DF1. The conductive layer M12 can be formed above the diffusion layer DF2. The resistive memory element RSE1 can be formed above the conductive layer M11. The resistive memory element RSE2 can be formed above the conductive layer M12.

The contact element CT1 can be formed between the diffusion layer DF1 and the conductive layer M11, coupled to the diffusion layer DF1 and the conductive layer M11, and at least partially overlapped with the diffusion layer DF1. In the top view, the contact element CT1 can be formed between the polysilicon layer PLY1 and the polysilicon layer PLY2. The contact element CT2 can be formed between the diffusion layer DF2 and the conductive layer M12, coupled to the diffusion layer DF2 and the conductive layer M12, and at least partially overlapped with the diffusion layer DF2. In the top view, the contact element CT2 can be formed between the polysilicon layer PLY1 and the polysilicon layer PLY2. The contact element CT1 and the contact element CT2 can be corresponding to the contact elements CT in FIG. 4.

The conductive via VA1 can be formed between the conductive layer M11 and the resistive memory element RSE1, coupled to the conductive layer M11 and the resistive memory element RSE1, and at least partially overlapped with the resistive memory element RSE1.

The conductive via VA2 can be formed between the conductive layer M12 and the resistive memory element RSE2, coupled to the conductive layer M12 and the resistive memory element RSE2, and at least partially overlapped with the resistive memory element RSE2. The conductive via VA1 and the conductive via VA2 can be corresponding to the conductive vias VA in FIG. 5.

The resistive memory element RSE1 and the resistive memory element RSE2 can be corresponding to the first resistive memory element 151 and the second resistive memory element 152 in FIG. 1 to FIG. 3.

As shown in FIG. 9, the conductive layer M21 can be formed between the resistive memory element RSE1 and the resistive memory element RSE2 in the top view. The conductive layer M31 can be formed above the resistive memory element RSE1, and at least partially overlapped with the resistive memory element RSE1.

The conductive layer M32 can be formed above the resistive memory element RSE2 and the conductive layer M21. The conductive layer M32 can be formed at least partially overlapped with the resistive memory element RSE2 and the conductive layer M21. The conductive layer M21 can be formed of the conductive layer M2 in FIG. 6. The conductive layer M31 and the conductive layer M32 can be formed of a same conductive layer, such as the conductive layer M3 in FIG. 7.

In FIG. 9, the conductive via V21 can be formed between the resistive memory element RSE1 and the conductive layer M31, coupled to the resistive memory element RSE1 and the conductive layer M31, and at least partially overlapped with the resistive memory element RSE1.

The conductive via V22 can be formed between the conductive layer M21 and the conductive layer M32, coupled to the conductive layer M21 and the conductive layer M32, and at least partially overlapped with the conductive layer M21.

The conductive via V23 can be formed between the resistive memory element RSE2 and the conductive layer M32, coupled to the resistive memory element RSE2 and the conductive layer M32, and at least partially overlapped with the resistive memory element RSE2. The conductive via V21, the conductive via V22 and the conductive via V23 in FIG. 9 can be corresponding to the conductive vias V2 in FIG. 7.

As shown in FIG. 9, the conductive layer M41, the conductive layer M42, the conductive layer M43 and the conductive layer M44 can be formed above the conductive layer M31 and the conductive layer M32. The conductive layer M41 can be formed at least partially overlapped with the conductive layer M32.

The conductive via V31 can be formed between the conductive layer M32 and the conductive layer M41, coupled to the conductive layer M32 and the conductive layer M41, and at least partially overlapped with the conductive layer M32. The conductive via V31 in FIG. 9 can be corresponding to the conductive vias V3 in FIG. 8. The conductive layer M41, the conductive layer M42, the conductive layer M43 and the conductive layer M44 in FIG. 9 can be formed of a same conductive layer, such as the conductive layer M4 in FIG. 8.

If the resistive memory element RSE1 and the resistive memory element RSE2 are corresponding to the first resistive memory element 151 and the second resistive memory element 152 in FIG. 1 and FIG. 2, the conductive layer M31 in FIG. 9 can be coupled to the first source line SL1 in FIG. 1, the conductive layer M41 in FIG. 9 can be coupled to the second source line SL2 in FIG. 1, the conductive layer M11 in FIG. 9 can be coupled to the source terminal of the first switch transistor 110 in FIG. 1, and the conductive layer M12 in FIG. 9 can be coupled to the source terminal of the second switch transistor 120 in FIG. 1.

Figure 10:
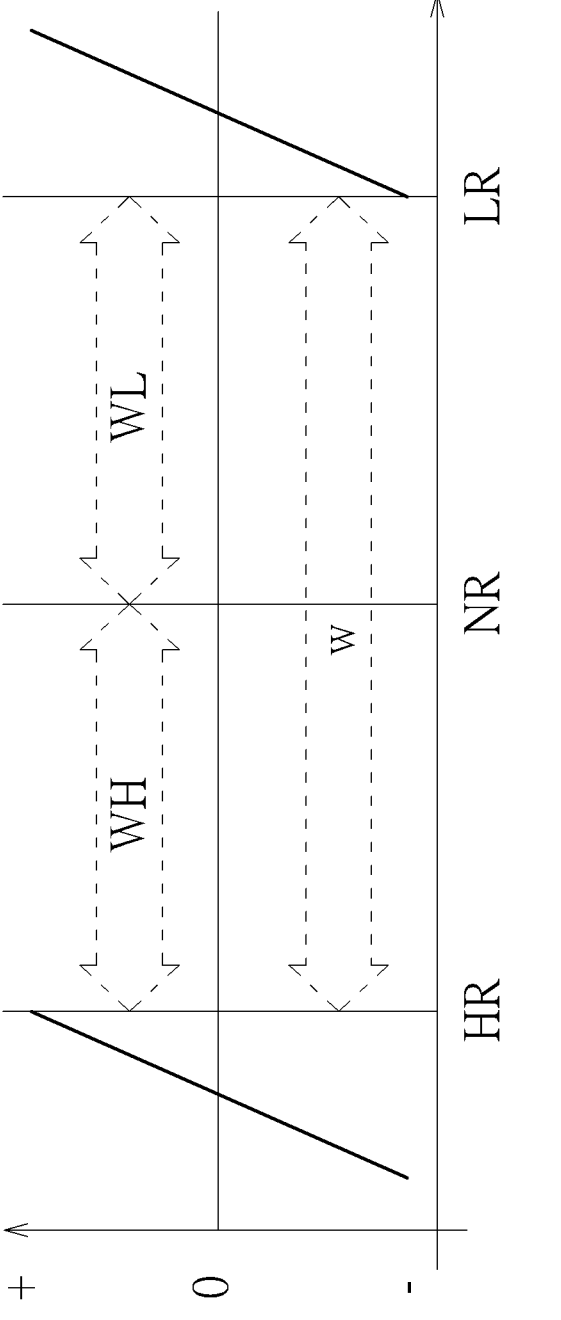
FIG. 10 illustrates the read window of reading data from
a plurality of memories according to an embodiment.

FIG. 10 illustrates the read window of reading data from a plurality of memories according to an embodiment. In FIG. 10, the horizontal axis represents the currents on the memories, and the vertical axis represents statistical number of memories generated after normalization. On the horizontal axis of FIG. 10, the level HR can be the current level where the resistive memory element of the memory is set to have a high resistance value, and a logic 0 is written to the memory. The level LR can be the current level where the resistive memory element of the memory is set to have a low resistance value, and a logic 1 is written to the memory. The level NR can be a reference current level when a machine is used to measure the memory.

If the memory 100 provided by the embodiment is not used, a memory can be read according to the current of a single resistive memory element, and the read operation is corresponding to a single mode operation. Hence, the window corresponding to the high resistance can be WH in FIG. 10, and the window corresponding to the low resistance can be WL in FIG. 10. It can be expressed as WH=|NR−HR| and WL=|LR−NR|.

If the memory 100 provided by the embodiment is in use, the memory can be read according to a difference of currents of two resistive memory elements, and the read operation is corresponding to a differential mode operation. Hence, the window corresponding to the high resistance and the low resistance can be expressed as W=|LR−HR|. Since |LR−HR| is greater than |NR−HR|, and |LR−HR| is greater than |LR−NR|, it can be expressed as W>WH and W>WL. As a result, when the memory 100 is in use, the read window is larger. With the larger read window, when the memory 100 is written and read many times (for example, but not limited to, 100,000 times), the data stored in the memory 100 can still be effectively determined as 0 or 1, improving the accuracy of reading the memory and the reliability of the memory.

In summary, by using the memory 100 of the embodiment, since the two resistive memory elements are arranged in the same direction, the connections among the components are simplified. The differential mode is used to enlarge the read window, so the accuracy of reading the memory and the reliability of the memory are improved after accessing the memory many times. In addition, through suitable circuit design, layout design and semiconductor structure, two memory cells (e.g. the memory 100 and the memory 200 in FIG. 3) can be coupled to one another to further reduce the circuit area. Hence, the memory and memory mini-array of embodiments are useful in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory comprising:
   a first diffusion layer formed along a first direction;
   a second diffusion layer formed along the first direction;
   a first polysilicon layer formed along a second direction and formed to at least partially overlap with the first diffusion layer and the second diffusion layer, wherein the first direction is perpendicular to the second direction;
   a second polysilicon layer formed along the second direction and formed to at least partially overlap with the first diffusion layer and the second diffusion layer;
   a first resistive memory element formed at least partially overlapped with the first diffusion layer and between the first polysilicon layer and the second polysilicon layer; and
   a second resistive memory element formed at least partially overlapped with the second diffusion layer and between the first polysilicon layer and the second polysilicon layer.

2. The memory of claim 1, wherein the first diffusion layer and the second diffusion layer are formed using a same diffusion layer.

3. The memory of claim 1, further comprising:
   a first conductive layer formed at least partially overlapped with the first diffusion layer and between the first polysilicon layer and the second polysilicon layer;
   a second conductive layer formed at least partially overlapped with the second diffusion layer and between the first polysilicon layer and the second polysilicon layer, wherein the first conductive layer and the second conductive layer are formed of a same conductive layer;
   a first contact element coupled to the first diffusion layer and the first conductive layer, and formed at least partially overlapped with the first diffusion layer, and between the first polysilicon layer and the second polysilicon layer;
   a second contact element coupled to the second diffusion layer and the second conductive layer, and formed at least partially overlapped with the second diffusion layer, and between the first polysilicon layer and the second polysilicon layer;
   a first conductive via coupled to the first conductive layer and the first resistive memory element, and formed at least partially overlapped with the first resistive memory element; and
   a second conductive via coupled to the second conductive layer and the second resistive memory element, and formed at least partially overlapped with the second resistive memory element.

4. The memory of claim 3, further comprising:

a third conductive layer formed between the first resistive memory element and the second resistive memory element;

a fourth conductive layer formed at least partially overlapped with the first resistive memory element;

a fifth conductive layer formed at least partially overlapped with the second resistive memory element and the third conductive layer, wherein the fourth conductive layer and the fifth conductive layer are formed of a same conductive layer;

a third conductive via coupled to the first resistive memory element and the fourth conductive layer, and formed at least partially overlapped with the first resistive memory element;

a fourth conductive via coupled to the third conductive layer and the fifth conductive layer, and formed at least partially overlapped with the third conductive layer; and a fifth conductive via coupled to the second resistive memory element and the fifth conductive layer, and formed at least partially overlapped with the second resistive memory element.

5. A memory mini-array comprising:

a first diffusion layer formed along a first direction;

a second diffusion layer formed along the first direction;

a first polysilicon layer formed along a second direction and at least partially overlapped with the first diffusion layer and the second diffusion layer, wherein the first direction is perpendicular to the second direction;

a second polysilicon layer formed along the second direction and at least partially overlapped with the first diffusion layer and the second diffusion layer;

a third polysilicon layer formed along the second direction and at least partially overlapped with the first diffusion layer and the second diffusion layer;

a fourth polysilicon layer formed along the second direction and at least partially overlapped with the first diffusion layer and the second diffusion layer, wherein the third polysilicon layer is formed between the second polysilicon layer and the fourth polysilicon layer;

a first resistive memory element formed at least partially overlapped with the first diffusion layer and between the first polysilicon layer and the second polysilicon layer;

a second resistive memory element formed at least partially overlapped with the second diffusion layer and between the first polysilicon layer and the second polysilicon layer;

a third resistive memory element formed at least partially overlapped with the first diffusion layer and between the third polysilicon layer and the fourth polysilicon layer; and a fourth resistive memory element formed at least partially overlapped with the second diffusion layer and between the third polysilicon layer and the fourth polysilicon layer;

wherein the first polysilicon layer, the second polysilicon layer, the first resistive memory element and the second resistive memory element are corresponding to a first memory;

the third polysilicon layer, the fourth polysilicon layer, the third resistive memory element and the fourth resistive memory element are corresponding to a second memory; and the memory mini-array comprises the first memory and the second memory.

6. A memory comprising:

a first diffusion layer;

a second diffusion layer;

a first conductive layer formed above the first diffusion layer;

a second conductive layer formed above the second diffusion layer;

a first resistive memory element formed above the first conductive layer;

a second resistive memory element formed above the second conductive layer;

a first contact element coupled to the first diffusion layer and the first conductive layer and formed between the first diffusion layer and the first conductive layer;

a second contact element coupled to the second diffusion layer and the second conductive layer and formed between the second diffusion layer and the second conductive layer;

a first conductive via coupled to the first conductive layer and the first resistive memory element and formed between the first conductive layer and the first resistive memory element; and a second conductive via coupled to the second conductive layer and the second resistive memory element and formed between the second conductive layer and the second resistive memory element;

wherein the first conductive layer and the second conductive layer are formed of a same conductive layer.

7. The memory of claim 6, further comprising:

a third conductive layer;

a fourth conductive layer formed above the first resistive memory element;

a fifth conductive layer formed above the second resistive memory element and the third conductive layer;

a third conductive via coupled to the first resistive memory element and the fourth conductive layer and formed between the first resistive memory element and the fourth conductive layer;

a fourth conductive via coupled to the third conductive layer and the fifth conductive layer and formed between the third conductive layer and the fifth conductive layer; and a fifth conductive via coupled to the second resistive memory element and the fifth conductive layer and formed between the second resistive memory element and the fifth conductive layer;

wherein the fourth conductive layer and the fifth conductive layer are formed of a same conductive layer.

8. The memory of claim 7, further comprising:

a sixth conductive layer formed above the fifth conductive layer; and a sixth conductive via coupled to the fifth conductive layer and the sixth conductive layer and formed between the fifth conductive layer and the sixth conductive layer.

* * * * *